United States Patent [19]

Kim

[11] Patent Number: 5,716,867
[45] Date of Patent: Feb. 10, 1998

[54] SOLID STATE IMAGE SENSOR

[75] Inventor: Yong Gwan Kim, Seongnam-si, Rep. of Korea

[73] Assignee: LG Semicon Co., Ltd., Chungcheongbuk-do, Rep. of Korea

[21] Appl. No.: 694,703

[22] Filed: Aug. 9, 1996

[30] Foreign Application Priority Data

Aug. 11, 1995 [KR] Rep. of Korea ............... 24836/1995

[51] Int. Cl.⁶ .................................................. H01L 21/70
[52] U.S. Cl. .................................... 437/53; 407/905
[58] Field of Search ........................ 437/53, 904, 905; 257/461

[56] References Cited

U.S. PATENT DOCUMENTS

| | | | |
|---|---|---|---|
| 5,485,207 | 1/1996 | Nam | 348/321 |
| 5,556,803 | 9/1996 | Lee | 437/53 |
| 5,565,374 | 10/1996 | Fukusho | 437/53 |
| 5,567,632 | 10/1996 | Nakashiba et al. | 437/35 |

*Primary Examiner*—John Niebling
*Assistant Examiner*—Joni Y. Chang
*Attorney, Agent, or Firm*—Morgan, Lewis and Bockius LLP

[57] ABSTRACT

Solid state image sensor of an improved charge transfer efficiency, including a first conductive type semiconductor substrate; a plurality of photodiodes each formed on a surface of the first conductive type semiconductor substrate; a second conductive type first well formed under the surface of the first conductive type substrate; a second conductive type second well formed under the surface of the first conductive semiconductor substrate so that a part of the second well forms an overlapped region with the first well; a plurality of first conductive type vertical charge coupled devices (VCCDs) each formed under a surface of a region of the first well for transferring signal charges generated in the photodiodes toward output side of the VCCD in response to external vertical transfer clock signals; vertical transfer gates formed extended over the plurality of the VCCDs for applying the external vertical transfer clock signals; a first conductive type horizontal charge coupled device (HCCD) formed in a region of the second conductive type second well for transferring the image signal charges transferred from the VCCDs toward an output side of the HCCD in response to external horizontal transfer clock signals; and, a plurality of horizontal transfer gates formed extended over the HCCDs for applying the horizontal transfer clock signals, characterized in that the overlapped region of the first well for forming the vertical charge coupled devices and the second well for forming the horizontal charge coupled device is only formed under the horizontal transfer gates within the horizontal charge coupled device.

7 Claims, 4 Drawing Sheets

SOLID STATE IMAGE SENSOR

BACKGROUND OF THE INVENTION

1. Field of the Invention

The present invention relates to a solid state image sensor, and more particularly, to a solid state image sensor having an improved charge transfer efficiency of signal charges.

2. Discussion of the Related Art

A conventional solid state image sensor will be explained with reference to the attached drawings. FIG. 1 illustrates a layout of the conventional solid state image sensor, FIG. 2a illustrates a section of the solid state image senor across the line I–I' in FIG. 1, and FIG. 2b illustrates a potential profile of the solid state image senor across the line I–I' in FIG. 1.

As shown in FIG. 1, the conventional solid state image sensor includes a plurality of photodiodes PD arranged in a form of a matrix under a surface of a semiconductor substrate. Each photodiode PD converts a light signal to an electrical video signal. The sensor includes a plurality of vertical charge coupled devices (VCCDs) 1 each formed between the photodiodes PD arranged in a form of a matrix for transferring a video signal charge generated by the photodiodes PD toward an output side by means of a plurality of transfer gates $VG_1$–$VG_4$ formed above the VCCDs 1. The sensor also includes a horizontal charge coupled device (HCCD) 2 formed at the output sides of the VCCDs 1 for transferring the video signal charges from the VCCDs 1 to an output side of the HCCD 2.

As shown in FIG. 1, there are a plurality of sets of four vertical transfer gates $VG_1$, $VG_2$, $VG_3$, and $VG_4$. The gates are formed alternatively above the VCCDs 1, which alternate their potential levels in succession for transferring the video signal charges from the photodiodes PDs toward the output side of respective VCCD 1 in response to a 4-phase clocking system. The vertical transfer gates $VG_1$–$VG_4$ have the vertical clock signals $V\phi_1$, $V\phi_2$, $V\phi_3$ and $V\phi_4$ applied thereto, respectively. There are a plurality of sets of two horizontal transfer gates $HG_1$ and $HG_2$. The gates are formed alternatively above the HCCD 2, which alternate their potential levels in succession for transferring the image signal charges from the VCCDs 1 toward the output side of the HCCD 2 according to a 2-phase clocking system. The gates $HG_1$ and $HG_2$ have the clock signals $H\phi_1$ and $H\phi_2$ applied thereto, respectively.

The HCCD 2 and the VCCDs 1 are formed in two P type wells 4 and 5 respectively each of which has a potential level that is different from the other. Here, because the VCCDs 1 and the HCCD 2 are formed under the surface of the substrate 3, they are sometimes called BCCDs (buried charge coupled devices). Referring to FIG. 1, the two wells 4 and 5 form an overlapped region 6 under a part of the last vertical transfer gate $VG_4$ and a part of each of the horizontal transfer gates $HG_1$ and $HG_2$ due to diffusion during their formation processes.

FIG. 2a illustrates a section of the solid state image sensor across the line I–I' in FIG. 1. FIG. 2a shows the P type wells 4 and 5 formed under the surface of the n type substrate 3, the n type VCCD regions 1 formed under the surface of the P type well 4, and the n type HCCD region 2 under the surface of the P type well 5. In this case, as explained above, the wells 4 and 5 inevitably form the overlapped region 6, shown in FIG. 2a, after driving of the sensor due to the diffusion during their formation processes.

One of the notable features in FIG. 2a is that the overlapped region 6 is formed under a part of the last vertical transfer gate $VG_4$ and a part of each of the horizontal transfer gates $HG_1$ and $HG_2$.

As shown in FIG. 3, in the solid state image sensor having the foregoing system, each of the image signal charges generated in the photodiodes PDs move toward the HCCD 2 through respective VCCDs 1 of which potential level alternates in succession by the vertical transfer clock signals $V\phi_1$, $V\phi_2$, $V\phi_3$, and $V\phi_4$. The image signal charges transferred through the VCCDs 1 are transferred to the sensing amplifier 7 through the HCCD 2 of which potential level alternates in succession by the horizontal clock signals $H\phi_1$ and $H\phi_2$. The sensing amplifier 7 amplifies each of the image signal charges with a predetermined gain.

However, as shown in FIG. 2b, which illustrates a potential profile of the solid state image sensor across line I–I', a P type concentration of the overlapped region 6 formed by the well 4 for the VCCDs 1 and the well 5 for the HCCD 2 becomes higher. Thus, the conventional solid state image sensor has a problem of lower charge transfer efficiency (CTE) due to the potential barrier 8 formed at the center of the overlapped region 6. That is, as shown in FIG. 3, a part of the image signal charges may not be transferred to the HCCD region 2 because of the potential barrier 8, and remain in a region between the VCCD 1 and the HCCD 2. Thus, the conventional solid state image sensor is susceptible to defects, such as black line defects on the display screen as a result of the non-efficient transfer of the image signal charges.

Instead of the potential barrier 8 in FIG. 2b, where the overlapped region 6 has a higher P type concentration, when n type concentrations of the VCCD regions 1 and the HCCD region 2 are substantially higher than the P type concentration of the overlapped region 6, the overlapped region 6 becomes an n conductive type, causing the center of the overlapped region 6 to form a potential pocket instead of the potential barrier. This also causes a drop in the charge transfer efficiency.

SUMMARY OF THE INVENTION

Accordingly, the present invention is directed to a solid state image sensor that substantially obviates one or more of the problems due to limitations and disadvantages of the related art.

Another object of the present invention is to provide a solid state image sensor having an improved charge transfer efficiency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a solid state image sensor comprises a substrate having a first conductivity type; a plurality of photodiodes on the substrate and producing signal charges; first and second well regions in the substrate, the first and second well regions having an overlapping region; a plurality of fast gates corresponding to the first well region and producing first signals; a plurality of second gates corresponding to the second well region and producing second signals, the overlapping region being substantially below the second gates; a plurality of first charge coupled devices corresponding to the first well region, the first charge coupled devices having output portions and transferring the signal charges from the photodiodes to the output portions in response to the first signals; and a second charge coupled device corresponding to the second well region and receiving the signal charges transferred from the first charge coupled devices, the second charge coupled device having an output portion and transferring the received signal charges to the output portion in response to the second signals.

In another aspect, the present invention provides a solid state image sensor comprising a first conductive type semiconductor substrate; a plurality of photodiodes on a surface of the first conductive type semiconductor substrate; a second conductive type first well under the surface of the first conductive type substrate; a second conductive type second well formed under the surface of the first conductive semiconductor substrate, the second well having a portion overlapping the first well; vertical transfer gates producing external vertical transfer clock signals; a plurality of first conductive type vertical charge coupled devices (VCCDs) each under a surface of the first well, the VCCDs transferring signal charges generated in the photodiodes to respective output portions of the VCCDs in response to the vertical transfer clock signals, the vertical transfer gates extending over the plurality of the VCCDs; a plurality of horizontal transfer gates producing horizontal transfer clock signals; and a first conductive type horizontal charge coupled device (HCCD) in a region of the second well for transferring the signal charges transferred from the VCCDs to an output portion of the HCCD in response to the horizontal transfer clock signals, the horizontal transfer gates extending over the HCCD; wherein the overlapping portion of the first well of the vertical charge coupled devices and the second well of the horizontal charge coupled device is substantially under the horizontal transfer gates within the horizontal charge coupled device.

In another aspect, the present invention provides a method for making a solid state image sensor, the method comprising the steps of forming a substrate having a first conductivity type; forming a plurality of photodiodes on the substrate and producing signal charges; forming first and second well regions in the substrate to have an overlapping region between the first and second well regions; forming a plurality of first gates corresponding to the first well region and producing first signals; forming a plurality of second gates corresponding to the second well region and producing second signals, the overlapping region being substantially below the second gates; forming a plurality of first charge coupled devices, having output portions, corresponding to the first well region and transferring the signal charges from the photodiodes to the output portions in response to the first signals; and forming a second charge coupled device, having an output portion, corresponding to the second well region and receiving the signal charges transferred from the first charge coupled devices, and transferring the received signal charges to the output portion in response to the second signals.

In a further aspect, the present invention provides a solid state image sensor including a first conductive type semiconductor substrate, a plurality of photodiodes formed on the surface of the first conductive type semiconductor substrate, a second conductive type first well formed under a surface of the first conductive type substrate, a second well formed under the surface of the first conductive semiconductor substrate so that a part of the second well makes an overlapped region with the first well, a plurality of first conductive type vertical charge coupled devices (VCCDs) formed under a surface of a region of the first well for transferring signal charges generated in the photodiodes toward output terminals of the VCCDs in response to external vertical transfer clock signals, vertical transfer gates formed to extend over the plurality of the VCCDs for applying the external clock signals, a first conductive type horizontal charge coupled device (HCCD) formed in the second conductive type second well region for transferring image signal charges transferred from the VCCDs toward an output terminal of the HCCD in response to external horizontal transfer clock signals, and a plurality of horizontal transfer gates formed extended over the HCCDs for applying the horizontal transfer clock signals, characterized in that the overlapped region of the first well for forming the vertical charge coupled devices and the second well for forming the horizontal charge coupled device is only formed in the horizontal charge coupled device under the horizontal transfer gates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

A preferred embodiment of a solid state image sensor in accordance with the present invention will now be explained with reference to the attached drawings.

Figure 3:
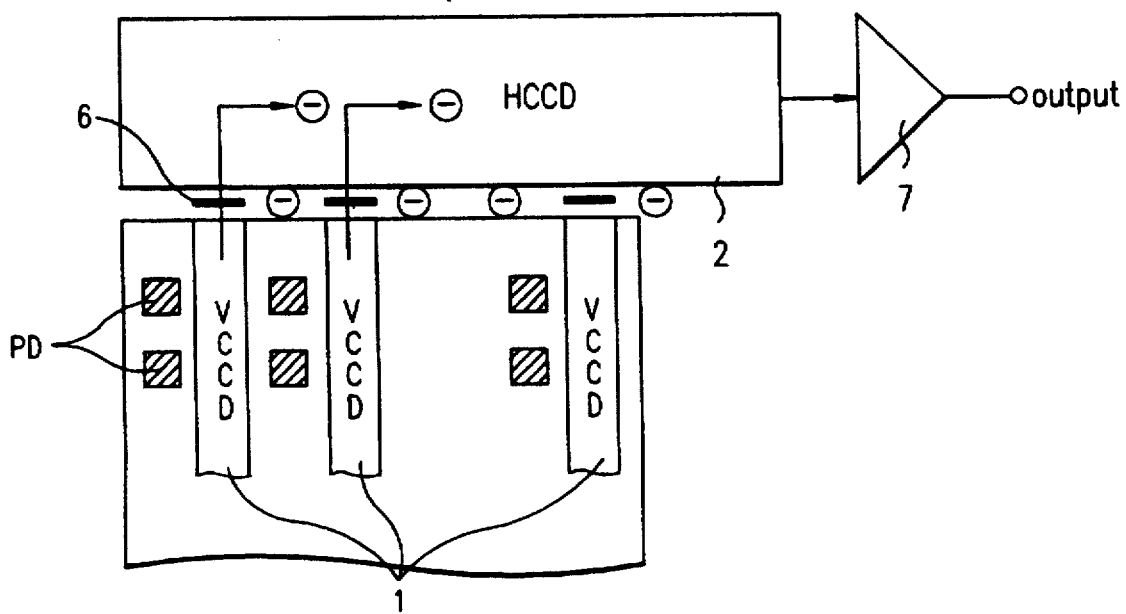
FIG. 3 shows a flow of image signal charges in the conventional solid state image sensor.
Figure 4:
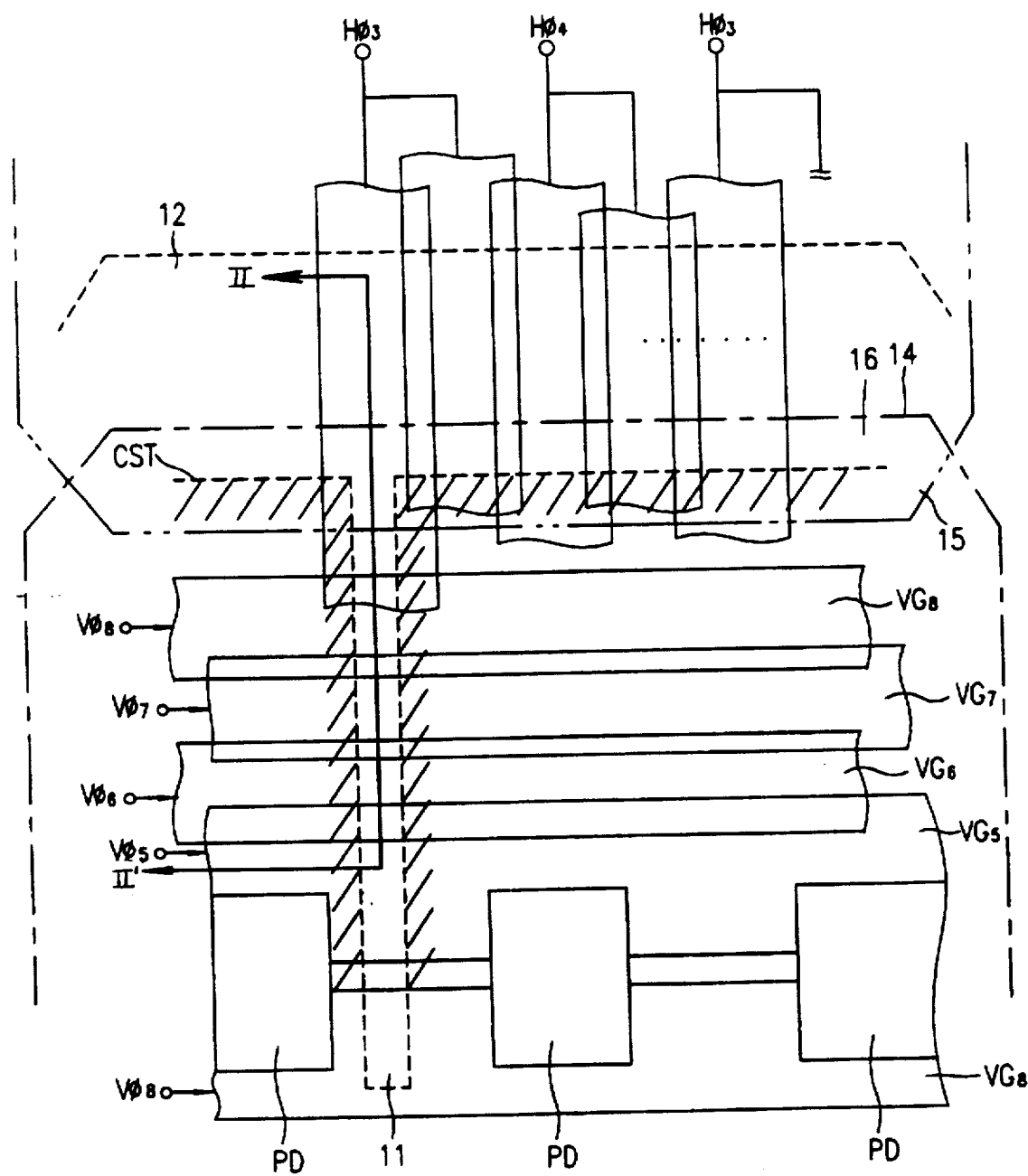
FIG. 4 is a layout of a solid state image sensor in accordance with the present invention.
Figure 5A:
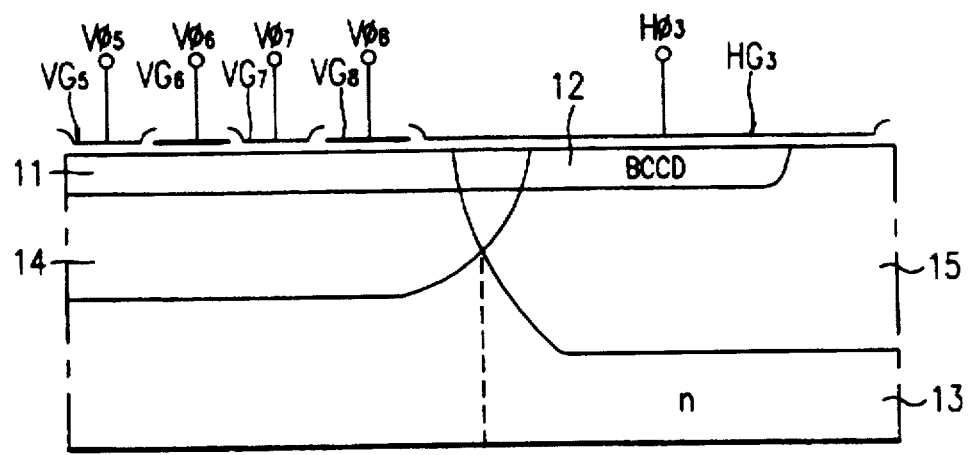
FIG. 5a illustrates a section of the solid state image senor across the line II–II' in FIG. 3.
Figure 5B:
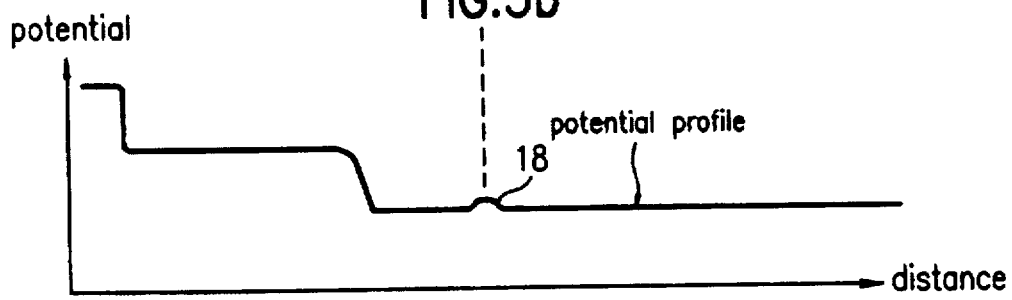
FIG. 5b illustrates a potential profile of the solid state image senor across the line II–II' in FIG. 3.

FIG. 4 is a layout of a solid state image sensor in accordance with the present invention, FIG. 5a illustrates a section of the solid state image senor across the line II–II' in FIG. 3, and FIG. 5b illustrates a potential profile of the solid state image senor across the line II–II' in FIG. 3.

As shown in FIG. 4, the solid state image sensor in accordance with an embodiment of the present invention includes a plurality of photodiodes PDs each formed under a surface of a semiconductor substrate arranged in a form of a matrix for converting a light signal into an electrical image signal charge. A plurality of vertical charge coupled devices (VCCDs) 11 are formed between the photodiodes PDs arranged in a form of a matrix for transferring the image signal charges generated in the photodiodes PDs toward output sides of the VCCDs 11 by means of a plurality of vertical transfer gates $VG_5$–$VG_8$ formed over the VCCDs 11. A horizontal charge coupled device (HCCD) 12 is formed at the output sides of the VCCDs 11 for transferring the image signal charges toward an output side of the HCCD 12.

As shown in FIG. 4, the solid state image sensor also has a plurality of four vertical transfer gate ($VG_5$, $VG_6$, $VG_7$ and $VG_8$) sets. The four vertical transfer gates $VG_5$, $VG_6$, $VG_7$ and $VG_8$ are formed alternatively over the VCCDs 11 for alternating potential levels of the four vertical transfer gates $VG_5$, $VG_6$, $VG_7$ and $VG_8$ in succession in response to a four phase clocking. The image signal charges are transferred from the photodiodes PDs toward output sides of the VCCDs 11, and the gates $VG_5$, $VG_6$, $VG_7$ and $VG_8$ have vertical clock signals $V\phi_5$, $V\phi_6$, $V\phi_7$ and $V\phi_8$ applied thereto respectively.

The solid state image sensor of the present invention also has a plurality of two horizontal transfer gate ($HG_3$ and $HG_4$) sets. The two horizontal transfer gates $HG_3$ and $HG_4$ are formed alternatively over the HCCD 12 for alternating potential levels of the two horizontal transfer gates $HG_3$ and $HG_4$ in succession in response to a two phase clocking. The image signal charges are transferred from the VCCDs 11 toward an output side of the HCCD 12, and the gates $HG_3$ and $HG_4$ have horizontal clock signals $H\phi_3$ and $V\phi_4$ applied thereto, respectively. The HCCD 12 and the VCCDs 11 are formed in two P type wells 14 and 15 which have different potential levels from the other.

The solid state image sensor of the present invention is substantially identical to the conventional solid state image sensor up to now.

The differences between the solid state image sensor of the present invention and the conventional sensor will be explained below with reference to the drawings.

Referring to FIG. 4, the two wells 14 and 15 form an overlapped region 16 after the drive-in process due to diffusion during the fabricating process. Unlike the conventional solid state image sensor, the solid state image sensor of the present invention has the overlapped region 16 formed only under the horizontal transfer gates $HG_3$ and $HG_4$.

Referring to FIG. 5a which shows a section across line II–II'of FIG. 4, the solid state image sensor of the present invention has an n type well 14 and a P type well 15 formed at a surface of an n type substrate 13, and a plurality of n type VCCDs 11 formed at a surface of the well 14 and one n type HCCD 12 formed in the well 15.

As has been already explained in the conventional art, the wells 14 and 15 unavoidably form the overlapped region 16 after the drive-in process of the sensor due to the diffusion conducted during the fabrication of the sensor. However, as discussed above, the solid state image sensor of the present invention has the overlapped region 16 formed only under the horizontal transfer gates $HG_3$ and $HG_4$, that is, only in the HCCD 12.

The operation of the solid state image sensor of the present invention having the aforementioned structure will be explained with reference to FIG. 6, which shows a flow of the image signal charges.

The image signal charges generated in the photodiodes PDs are transferred toward the HCCD 12 through the VCCDs 11 of which potential levels alternate in succession by the vertical clock signals $V\phi_5$–$V\phi_8$ applied to the vertical transfer gates $VG_5$–$VG_8$, respectively. The image signal charges transferred through the VCCDs 11 are transferred to the sensing amplifier 17 through the HCCD 12 of which potential level alternates by horizontal transfer clock signals $H\phi_3$ and $H\phi_4$. The sensing amplifier 17 senses and amplifies the image signal charges with a predetermined gain.

Figure 1:
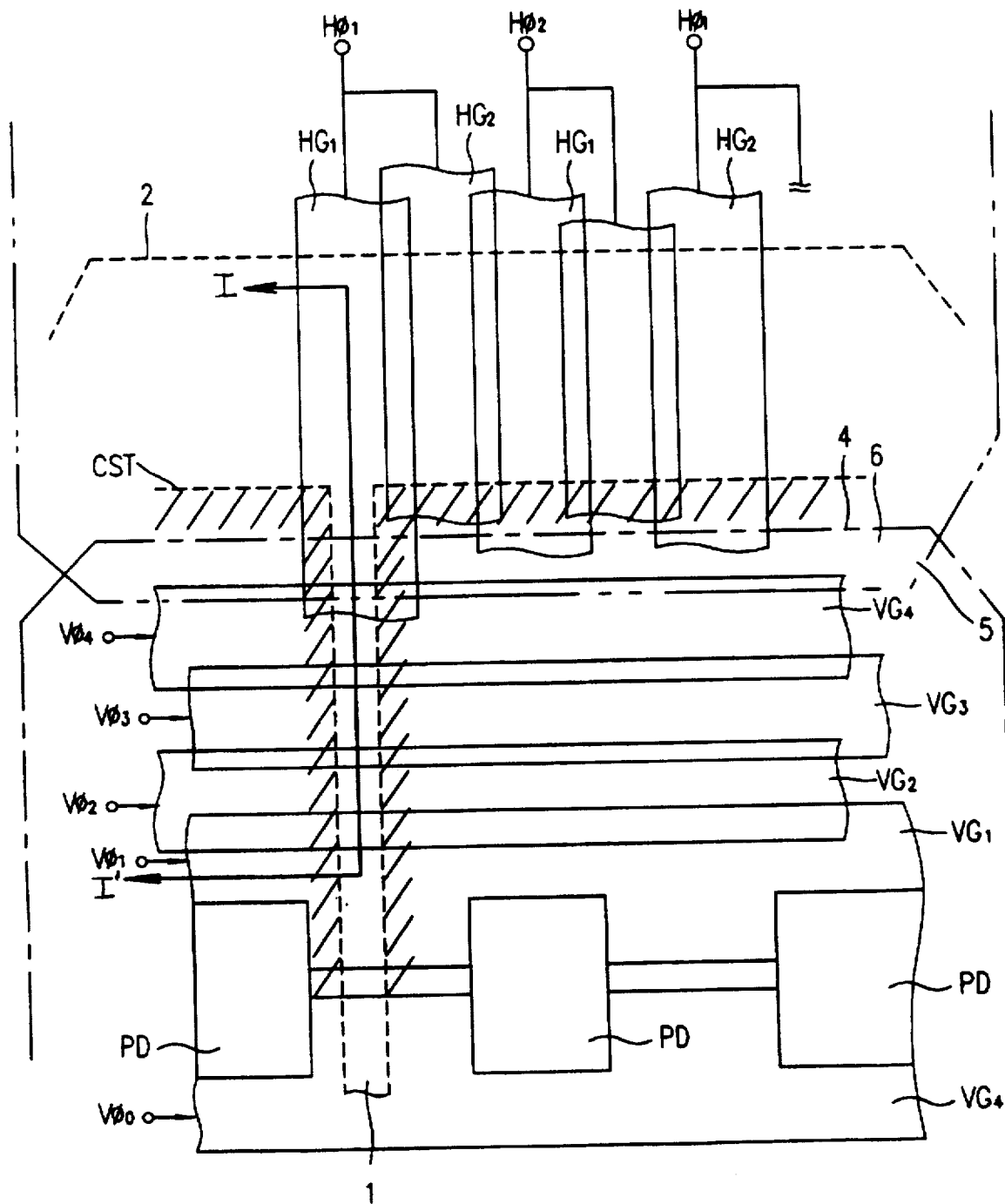
FIG. 1 illustrates a layout of a conventional solid state image sensor.
Figure 2A:
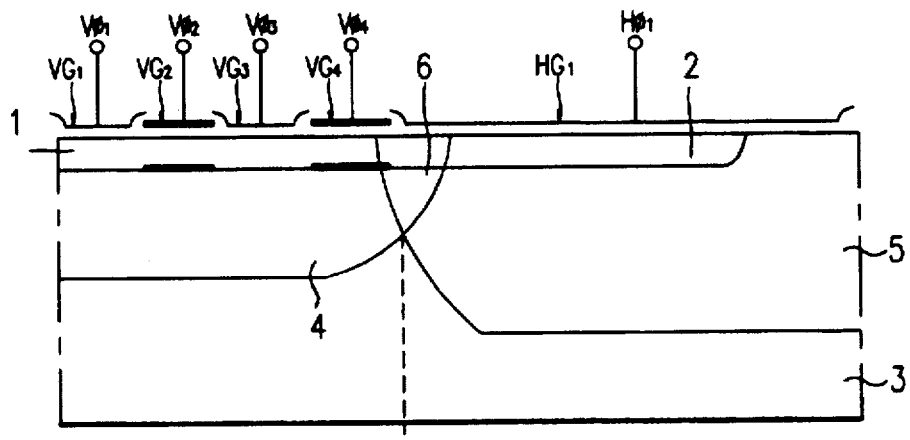
FIG. 2a illustrates a section of the solid state image senor across the line I–I' in FIG. 1.
Figure 2B:
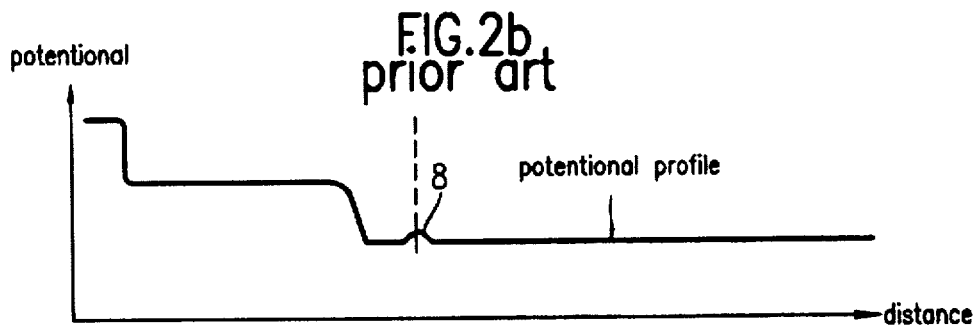
FIG. 2b illustrates a potential profile of the solid state image senor across the line I–I' in FIG. 1.

In this case, as explained in the conventional art, since the P type concentration of the overlapped region 16 of the wells 14 and 15 becomes higher than the wells 14 and 15, as shown in FIGS. 4 and 5a, a potential barrier 18 is formed at the center of the overlapped region 16. However, as shown in FIG. 6, since the potential barrier 18 is present only under the horizontal transfer gates $HG_3$ and $HG_4$, the potential barrier 18 does not decrease the charge transfer efficiency of the solid state image sensor, unlike the potential barrier 8 in the conventional solid state image sensor shown in FIG. 2b.

That is, since the potential barrier 18 is formed within the HCCD 12, even though the image signal charges are divided by the potential barrier 18, they meet at the output side of the HCCD 12 in the end and are delivered to the sensing amplifier 17 together.

Figure 6:
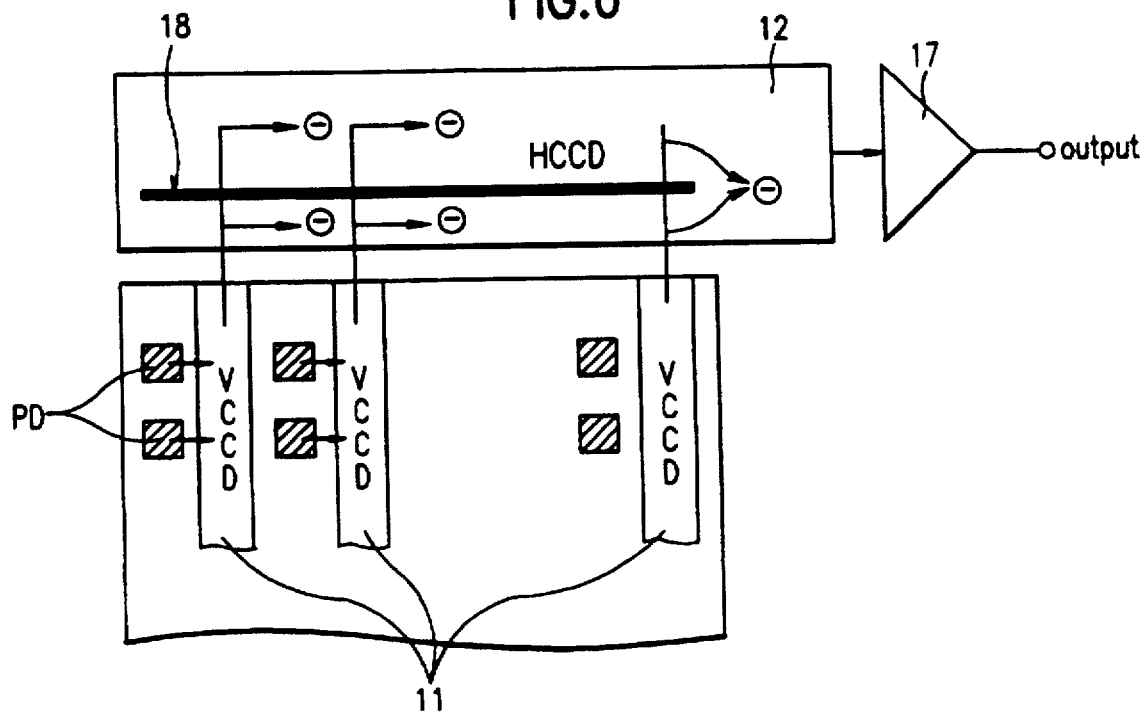
FIG. 6 shows a flow of image signal charges in the solid state image sensor in accordance with the present invention.

Referring to FIG. 6, explaining the flow of the image signal charges in the solid state image sensor in accordance with the present invention, even if the potential barrier 18 is formed due to the overlapped region 16, since the potential barrier 18 is formed under the horizontal charge transfer gates $HG_3$ and $HG_4$ within the HCCD 12, the image signal charges can be transferred toward the sensing amplifier 17 without loss. Thus, the solid state image sensor of the present invention can prevent defects, such as black lines which are found in the conventional solid state image sensor.

Accordingly, the present invention provides a solid state image sensor having an overlapped region of VCCD and HCCD well regions. The overlapped region is formed preferably only under horizontal transfer gates to improve the charge transfer efficiency.

It will be apparent to those skilled in the art that various modifications and variations can be made in the solid state image sensor of the present invention without departing from the spirit or scope of the invention. Thus, it is intended that the present invention cover the modifications and variations of this invention provided they come within the scope of the appended claims and their equivalents.

What is claimed is:

1. A method for making a solid state image sensor, the method comprising the steps of:

forming a substrate having a first conductivity type;

forming a plurality of photodiodes on the substrate and producing signal charges;

forming first and second well regions in the substrate to have an overlapping region between the first and second well regions;

forming a plurality of first gates corresponding to the first well region and producing first signals;

forming a plurality of second gates corresponding to the second well region and producing second signals, the overlapping region being only under the second gates;

forming a plurality of first charge coupled devices, having output portions, corresponding to the first well region and transferring the signal charges from the photodiodes to the output portions in response to the first signals; and forming a second charge coupled device, having an output portion, corresponding to the second well region and receiving the signal charges transferred from the first charge coupled devices, and transferring the received signal charges to the output portion in response to the second signals.

2. The method according to claim 1, wherein the step of forming the first charge coupled devices includes the step of forming vertical charge coupled devices.

3. The method according to claim 1, wherein the step of forming the second charge coupled device includes the step of forming a horizontal charge coupled device.

4. The method according to claim 1, wherein the step of forming the first gates includes the step of forming vertical transfer gates.

5. The method according to claim 1, wherein the step of forming the second gates includes the step of forming horizontal transfer gates.

6. The method according to claim 1, wherein the step of forming the first signals includes the step of forming vertical transfer clock signals.

7. The method according to claim 1, wherein the step of forming the second signals includes the step of forming horizontal transfer clock signals.

* * * * *